United States Patent [19]

Higgins

[11] Patent Number: 5,154,661
[45] Date of Patent: Oct. 13, 1992

[54] THERMAL ELECTRIC COOLING SYSTEM AND METHOD
[75] Inventor: Robert W. Higgins, San Jose, Calif.
[73] Assignee: Noah Precision, Inc., San Jose, Calif.
[21] Appl. No.: 727,986
[22] Filed: Jul. 10, 1991
[51] Int. Cl.$^5$ ............................................. F25B 21/02
[52] U.S. Cl. ........................................ 62/3.3; 62/3.2
[58] Field of Search ................ 62/3.2, 3.3, 3.1, 3.64

[56] References Cited

U.S. PATENT DOCUMENTS

| | | | |
|---|---|---|---|
| 2,837,899 | 6/1958 | Lindenblad | 62/3.2 |
| 2,970,450 | 2/1961 | Roeder, Jr. et al. | 62/3.3 |
| 3,008,300 | 11/1961 | Ryan et al. | 62/3.3 |
| 3,139,734 | 7/1964 | Kuckens et al. | 62/3.3 |
| 3,178,895 | 4/1965 | Mole et al. | 62/3.2 |
| 4,593,529 | 6/1986 | Birochik | 62/3.3 |
| 4,829,771 | 5/1989 | Koslow et al. | 62/3.64 |
| 4,833,888 | 5/1989 | Kerner et al. | 62/3.3 |
| 4,977,953 | 12/1990 | Yanagishi et al. | 62/3.3 |
| 4,989,626 | 2/1991 | Takagi et al. | 62/3.3 |
| 5,063,582 | 11/1991 | Mori et al. | 378/34 |

Primary Examiner—Albert J. Makay
Assistant Examiner—William C. Doerrler
Attorney, Agent, or Firm—Flehr, Hohbach, Test, Albritton & Herbert

[57] ABSTRACT

Thermal electric liquid cooling system having a tank for containing the liquid. A cooling plate is secured to the tank and forms a part of the tank. The cooling plate is formed of a heat conductive material and has first and second surfaces with the first surface in contact with the liquid in the tank. A plurality of thermal electric modules are in contact with the second surface of the cooling plate. A cooling manifold is secured to the cooling plate and is in engagement with the thermal electric cooling devices and serves to sandwich the thermal electric cooling modules between the cooling plate and the cooling manifold. Means is provided for supplying a liquid coolant to the cooling manifold to withdraw heat from the cooling manifold.

10 Claims, 2 Drawing Sheets

THERMAL ELECTRIC COOLING SYSTEM AND METHOD

This invention relates to a thermal electric cooling system for liquids, and more particularly to such a system which is a solid-state product CFC free.

In U.S. Pat. No. 5,029,445 issued on Jul. 9, 1991 there is disclosed a thermal electric cooling system for liquids which incorporates muffin fans and a pump motor. It has been found in certain applications that the thermal electric cooling system disclosed in U.S. Pat. No. 5,029,445 is too bulky and is objectionable on some applications because of the fan noise and particle generation. There is therefore a need for a new and improved thermal electric cooling system.

In general, it is an object of the present invention to provide a thermal electric cooling system which is relatively compact and a method for operating the same.

Another object of the invention is to provide a system of the above character which is self-contained and can provide heating and chilling.

Another object of the invention is to provide a system of the above character which eliminates the need for muffin fans.

Another object of the invention is to provide a system of the above character in which the thermal electronics are utilized to transfer cooling to an internal heat exchanger.

Another object of the invention is to provide a system of the above character which does not generate particles.

Another object of the invention is to provide a system of the above character which can be utilized in Class 10 to Class 1 cleanrooms.

Another object of the invention is to provide a system of the above character in which heat is removed by water through a water jacket.

Another object of the invention is to provide a system of the above character which is reliable and efficient.

Additional objects and features of the invention will appear from the following description in which the preferred embodiments are set forth in conjunction with the accompanying drawings.

In general the thermal electric liquid cooling system of the present invention consists of a tank for containing the liquid. A cooling plate is secured to the tank and forms a part of the tank. The cooling plate is formed of a heat conductive material and has first and second surfaces with the first surface in contact with the liquid in the tank. A plurality of thermal electric modules are in contact with the second surface of the cooling plate. A cooling manifold is secured to the cooling plate and is in engagement with the thermal electric cooling devices and serves to sandwich the thermal electric cooling modules between the cooling plate and the cooling manifold. Means is provided for supplying a liquid coolant to the cooling manifold to withdraw heat from the cooling manifold.

Figure 1:
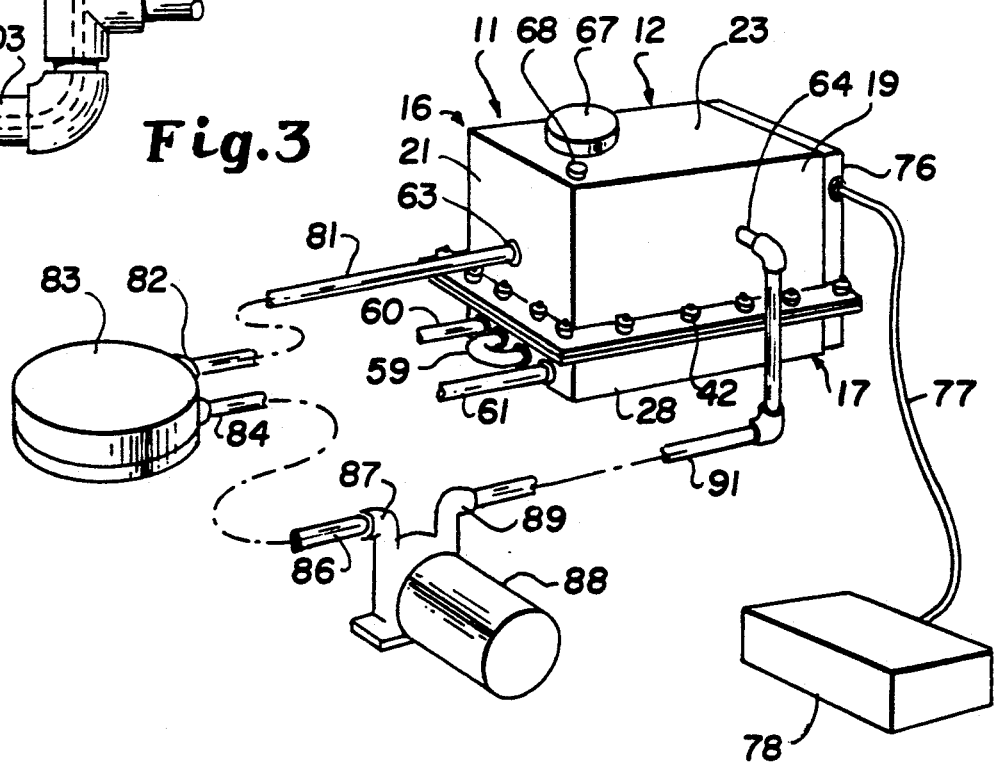
FIG. 1 is an isometric view of a thermal electric cooling system incorporating the present invention which is utilized for cooling a wafer chuck.
Figure 4:
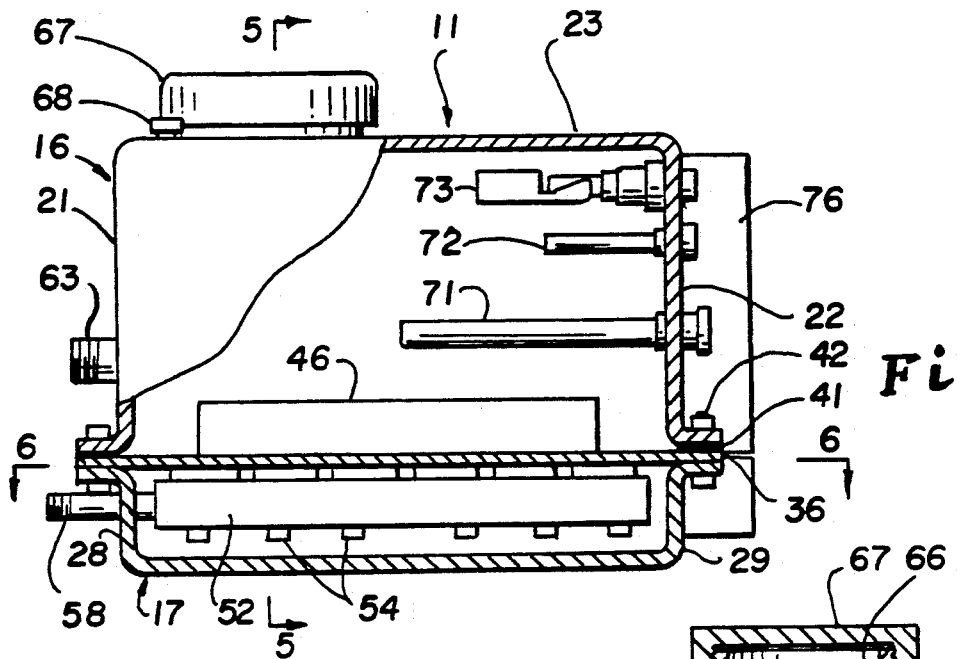
FIG. 4 is a side elevational view partially in cross-section of the thermal electric cooler shown in FIGS. 1 and 2.
Figure 5:
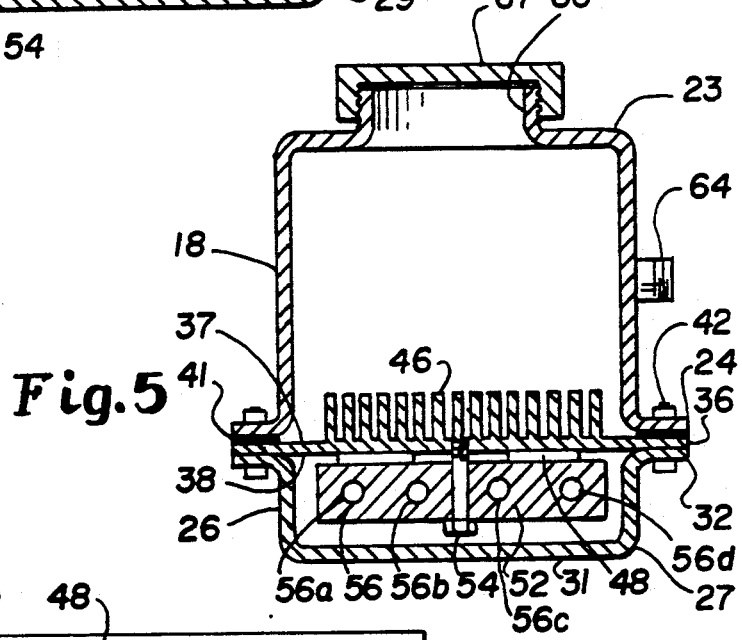
FIG. 5 is an end elevational view in cross-section taken along the line 5—5 of FIG. 4.
Figure 6:
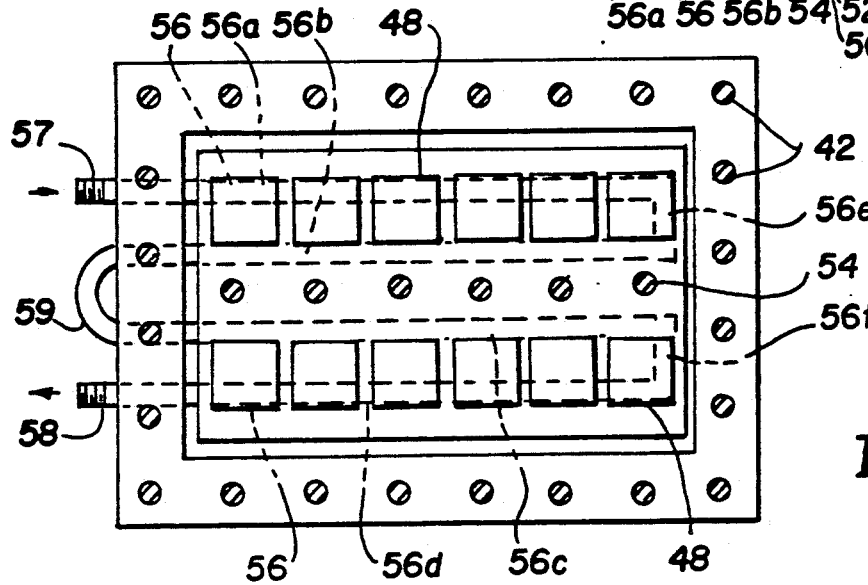
FIG. 6 is a cross-sectional view of the thermal electric cooler shown in FIGS. 1 and 2 taken along the line 6—6 of FIG. 4.

More in particular, the thermal electric cooling system 11 of the present invention as shown in FIG. 1 consists of a thermal electric cooler 12 which is shown in detail in FIGS. 4, 5 and 6. As shown therein, the thermal electric cooler 12 consists of an upper tank 16 and a lower tank 17. The upper tank 16 is generally rectangular in configuration and is provided with spaced apart parallel side walls 18 and 19, and spaced apart end walls 21 and 22 which adjoin the side walls 18 and 19 at right angles thereto. A flange 24 which is secured to the lower extremities of the side walls 18 and 19 and the end walls 21 and 22 and extend horizontally therefrom.

The lower tank 17 also has a rectangular configuration and is provided with spaced apart parallel side walls 26 and 27, and spaced apart parallel end walls 28 and 29 which adjoin the side walls 26 and 27 at right angles thereto. It is also provided with a bottom wall 31. A flange 32 extends around the upper extremities of the side walls 26 and 27 and end walls 28 and 29 and extends at right angles or horizontally therefrom. A thermal electric unit or plate 36 is provided which is formed of a suitable conducting metal such as aluminum which is generally planar and is provided with first and second planar parallel surfaces 37 and 38. The plate 36 has generally the same dimensions as the flanges 24 and 32. A gasket 41 is disposed between the flange 24 and the second surface 38 of the plate 36 to form a fluid-tight seal between the plate 36 and the flange 24 and for the upper tank 16. The upper tank 16, the gasket 41, the thermal electric unit or plate 36 and lower tank 17 are secured into a unitary assembly by bolts 42 extending through the flanges 24 and 32 and the gasket 41 and the plate 36.

A plurality of spaced apart parallel vertically upstanding fins 46 are mounted on the plate 36 and are also formed of a suitable conducting material as aluminum. The fins 46 can be formed of separate elements and then bonded to the plate 36, or, alternatively, the plate 36 with the upstanding fins 46 can be formed integral in a suitable manner such as by forming both the plate and the fins from an aluminum extrusion. As can be seen from FIG. 5, the fins 46 extend upwardly into the upper tank 16 and are adapted to come into contact with any liquid placed in the upper tank 16. Thus the fins 46 with the associated plate 36 serve as a heat sink.

The thermal electric unit 34 also includes a plurality of spaced apart thermal electric cooler cells 48 of a suitable size, as for example approximately 1¼" by 1¼" with a thickness of approximately ⅛". These cells or modules 48 are of a conventional type manufactured by Marlow Industries, Inc., at 10451 Vista Park Road, Dallas, Tex., 75232. As shown in FIG. 6, twelve of such cells or modules 48 have been provided and arranged with six in two spaced apart parallel rows on the bottom or first surface of the plate 37 and are held in intimate contact therewith and are sandwiched between the bottom or second surface 38 of plate 36 and the upper or first surface 51 of a water jacket or manifold 52.

The water jacket or manifold 52 is formed of a suitable conducting material such as aluminum and is secured to the plate 36 by suitable means such as screws 54. The manifold 52 is provided with a serpentine flow passage 56 which extends through the manifold as shown in dotted lines in FIG. 6 and is in communication with an inlet fitting 57 and an outlet fitting 58 mounted on one end of the manifold facing the end wall 28 of the lower tank 17. The serpentine flow passage provides spaced parallel passages 56a, 56b, 56c and 56d lying adjacent each of the two rows of thermal electric cells or modules 48 as shown particularly in FIG. 6. The passages 56a and 56b are interconnected by a passage 56e and passages 56c and 56d are interconnected by a passage 56f. Passages 56b and 56c are interconnected by a U 59. The inlet and outlet fittings 57 and 58 are connected to piping 60 and 61 for supplying a suitable cooling liquid such as water to the serpentine flow passage 56 within the manifold 52.

An inlet fitting 63 is provided on the front end wall 21 of the upper tank 16 and an outlet fitting 64 is provided in the side wall 19 of the upper tank 16. A large cleanout opening 66 is also provided in the top wall 33 and has a removable threaded cap 67 mounted thereon. Another fitting 68 is also provided in the top wall 23 and there is provided a valve (not shown) mounted therein to permit the bleeding of air into and out of the upper tank 16 as the same is being filled with liquid or liquid is being withdrawn therefrom. A rod-like or cylindrical cartridge electric heater 71 is mounted in the end wall and is provided for heating the liquid in the upper tank 16 as hereinafter described. A temperature switch 72 and a liquid level float switch 73 are also mounted in the end wall 22.

A compartment 76 is mounted on the end 22 of the upper tank 16 and is provided for making electrical connections to the heater 71, the temperature sensor 72 and the liquid level switch 73 as well as for making connections to the thermal electric unit 34 with the cells or modules 48 therein.

As shown in FIG. 1, the lines 59 and 61 connected to the manifold 52 are connected to a heat exchanger and a city water supply in a conventional manner. The compartment 76 is connected by a control cable 77 connector to a controller 78.

The inlet fitting 63 is connected by a line or conduit 81 to a fitting 82 provided on a wafer chuck 83. An outlet 64 on the wafer chuck is connected by a line 86 to the outlet 87 of a pump 88. Inlet 89 to the pump 81 is connected by a line 91 to the outlet 64 on the upper tank 16.

The operation and use of the system shown in FIG. 1 may now be briefly described as follows. Let it be assumed that wafers (not shown) are transported from a hot zone onto the wafer chuck 83. The wafer chuck serves to cool the wafers down to a predetermined desired temperature plus or minus 1/10th of a degree. The upper tank 16 is filled with the cooling liquid, as for example distilled water, which is cooled to a desired temperature by the thermal electric unit 34 under the control of the controller 78. The controller 78 can be of a conventional type, as for example a proportional plus integral plus derivative type of controller. Such controller responds to the rate at which the measurement is changing even though the actual error is still small. When the temperature measurement starts to change, derivative action generates an immediate response proportional to its rate of change to provide a precision temperature control for the liquid within the thermal electric cooler 12 and to thereby provide a liquid at a predetermined temperature to the wafer chuck 83. In the operation of the system, the thermal electric cells or modules 48 are always operating under the same polarity so that the thermal electric cells or modules 48 are always cooling and are not used for heating. If heat is needed to maintain the desired temperature, the heat is supplied from the cartridge heater 71 to provide the constant temperature under the control of the controller 78. Since polarity is not reversed on the thermal electric cells or modules 48, improved reliability is obtained from the thermal electric cells or modules 48.

Figure 2:
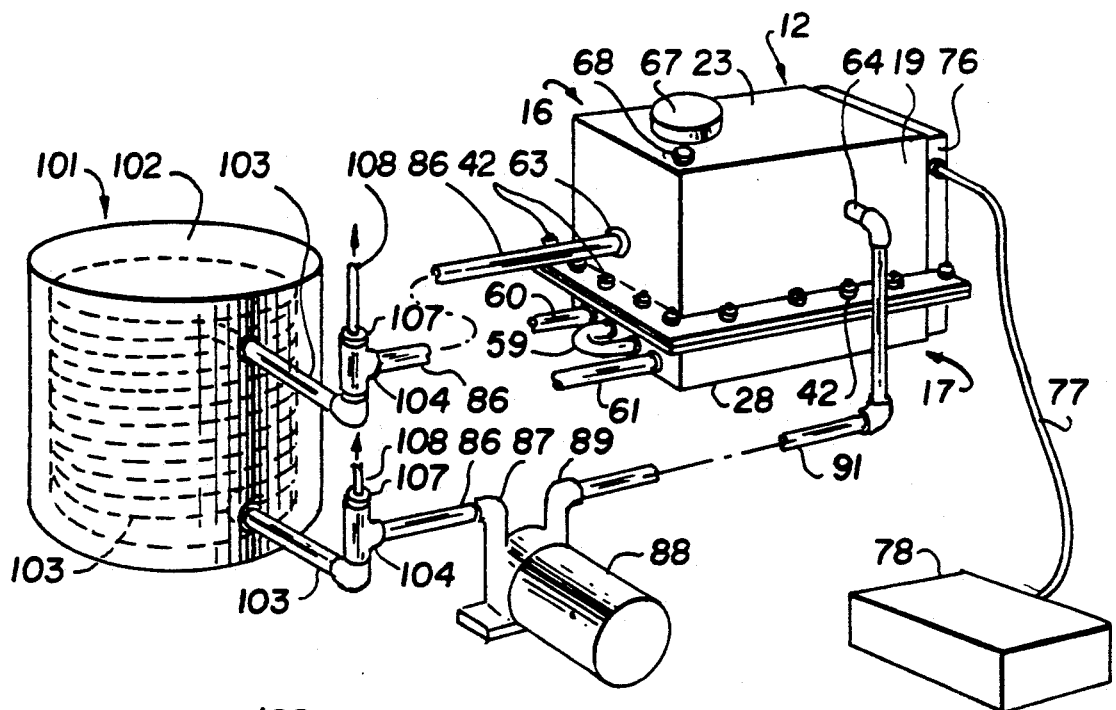
FIG. 2 is an isometric view of a system of the above character similar to FIG. 1 used for cooling developer.
Figure 3:
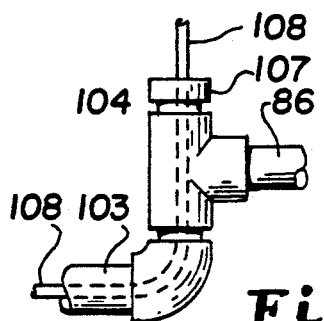
FIG. 3 is an enlarged elevational view showing the tee-type connections shown in FIG. 2.

Another system 101 shown in FIG. 2 utilizes the thermal electric cooler 12 for cooling a developer in a developer cooling tank 102 which is provided with a coil 103 which is helically wound into a cylindrical shape. The coil 103 is connected to the lines 81 and 86 of a suitable size such as 1" through tees 104 to the cooler 12 through the pump 88 so that a cooling liquid is pumped through the coil 103. The developer to be cooled is supplied from a tank (not shown) to the coil 103 through a line 106 of a suitable size as for example ¼" through a plug 107 mounted in one leg of the tee 104. The line 106 extends through the coil 103 and is connected to a line 108 which exits through the other tee 104 and a plug 107 is provided therein and is connected to the wafer process station (not shown) for use therein. In this manner it can be seen that heat or cold can be transferred from the liquid within the lines 81 and 86 under the control of the controller 78 for the thermal electric cooler 12 to cool or heat the developer flowing internally of lines 106 and 108 within the coil 103 in which the cooling liquid from the thermal electric cooler 12 is flowing. In this way, a developer can be maintained at a predetermined desired temperature.

From the foregoing it can be seen that thermal electric coolers of the present invention are ideally suited to a wide variety of systems because of their size, wide operating range, low power requirements and high reliability. The thermal electric coolers in the systems of the present invention are solid state with no moving parts. Since there are no moving parts, extreme reliability is obtained which reduces downtime. They are environmentally more desirable because they do not use conventional refrigerants such as Freon and CFCs (chlorofluorocarbons). They also do not use corrosive liquids and gases. There are no compressor noises or particle generating fans.

By way of example, thermal electric coolers made in accordance with the present invention have had the ability to cool and heat the tank contents from 40° C. to 15° C. and keep a precise temperature control with a tolerance of plus or minus 0° C. The physical size for one cooler provides a small footprint, as for example 10½" wide, 16" long and 11" high.

What is claimed is:

1. In a thermal electric cooling system for a liquid, a horizontally disposed tank for containing the liquid, a horizontal cooling plate secured to the tank and forming a section of the bottom of the tank, said cooling plate being formed of a heat conductive material and having a first inwardly facing surface and a second downwardly facing surface and having the first upward facing surface in contact with the liquid in the tank, a plurality of thermal electric modules in contact with the second downwardly facing surface of the cooling plate, a cooling manifold having liquid flow passage therein secured to the cooling plate and in engagement with the thermal electric cooling devices and serving to sandwich the thermal electric cooling modules between the cooling plate and the cooling manifold and means for supplying a liquid coolant to the liquid flow passages of the cooling manifold to withdraw heat from the cooling manifold.

2. A system as in claim 1 together with a plurality of horizontally spaced apart vertically disposed parallel fins extending inwardly into the tank and in contact with the liquid and being in contact with the first surface of the cooling plate.

3. A system as in claim 1 wherein the cooling manifold is secured to the cooling plate by a plurality of screws.

4. A system as in claim 1 wherein said cooling plate forms the bottom wall of said tank and forms a liquid tight seal therewith.

5. A system as in claim 1 together with a wafer chuck and means for supplying a liquid from within the tank to the wafer chuck for maintaining the wafer chuck at a predetermined temperature.

6. A system as in claim 1 together with piping having a liquid therein to be cooled, means disposed in the vicinity of the piping for conveying a liquid from and to the tank and in contact with the piping so that energy is transferred from the liquid in the piping to the liquid conveyed to and from the tank.

7. A system as in claim 1 wherein said tank is provided with a removable fill cap together with a liquid level sensor disposed within the tank.

8. In a thermal electric cooling system for a liquid, a tank for containing the liquid, a cooling plate secured to the tank and forming a section of the bottom of the tank, said cooling plate being formed of a heat conductive material and having first and second surfaces and having the first surface in contact with the liquid in the tank, a plurality of thermal electric modules in contact with the second surface of the cooling plate, a cooling manifold secured to the cooling plate and in engagement with the thermal electric cooling devices and serving to sandwich the thermal electric cooling modules between the cooling plate and the cooling manifold and means for supplying a liquid coolant to the cooling manifold to withdraw heat from the cooling manifold, contact means connected to said thermal electric cooling devices for operating said thermal electric cooling devices continuously in a cooling mode and an electric heater mounted within the tank for supplying heat to the liquid in the tank when the liquid coolant drops below a predetermined temperature.

9. A system as in claim 8 together with a temperature sensor disposed within the tank controlling the operation of the electric heater.

10. A method for cooling a liquid in a tank having a cooling plate with thermal electric modules mounted thereon forming a section of the bottom of the tank and with an electric heater mounted in the tank comprising supplying electrical energy to one polarity of the thermal electric modules so that the thermal electric modules are always in the cooling mode and supplying electrical energy when needed to the electric heater to supply heat to maintain the liquid within the tank at a predetermined temperature.

* * * * *